US012687793B2

(12) United States Patent
Tandon

(10) Patent No.: US 12,687,793 B2
(45) Date of Patent: Jul. 21, 2026

(54) MULTIPLE TARGETS ON SUBSTRATE LAYERS FOR LAYER ALIGNMENT

(71) Applicant: Intel Corporation, Santa Clara, CA (US)

(72) Inventor: Shakul Tandon, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 179 days.

(21) Appl. No.: 17/561,721

(22) Filed: Dec. 24, 2021

(65) Prior Publication Data

US 2023/0205104 A1     Jun. 29, 2023

(51) Int. Cl.
| | |
|---|---|
| *G03F 9/00* | (2006.01) |
| *G03F 1/42* | (2012.01) |
| *G03F 1/84* | (2012.01) |
| *G03F 7/00* | (2006.01) |
| *G06T 7/00* | (2017.01) |
| *G06T 7/66* | (2017.01) |
| *G06T 7/73* | (2017.01) |
| *H01J 37/22* | (2006.01) |
| *H10W 46/00* | (2026.01) |

(52) U.S. Cl.
CPC .............. *G03F 9/7076* (2013.01); *G03F 1/42* (2013.01); *G03F 1/84* (2013.01); *G03F 7/70633* (2013.01); *G03F 7/70683* (2013.01); *G03F 9/7046* (2013.01); *G06T 7/0004* (2013.01); *G06T 7/66* (2017.01); *G06T 7/73* (2017.01); *H01J 37/222* (2013.01); *H10W*

*46/00* (2026.01); *G06T 2207/30148* (2013.01); *H10W 46/301* (2026.01); *H10W 46/401* (2026.01)

(58) Field of Classification Search
CPC .......... G03F 7/70633; G03F 1/42; G03F 1/84; G03F 7/70683; H01L 23/544; H01L 2223/54426
See application file for complete search history.

(56) References Cited

U.S. PATENT DOCUMENTS

| | | | |
|---|---|---|---|
| 10,890,436 B2 * | 1/2021 | Amir ................... | G03F 7/70633 |
| 2017/0357154 A1 * | 12/2017 | Oh ......................... | H01L 22/20 |

OTHER PUBLICATIONS

M. Harada et. al., "In-die overlay metrology method using SEM images", J. Micro/Nanolith. MEMS MOEMS, vol. 17, 044004 (Year: 2018).*

* cited by examiner

*Primary Examiner* — Britt Hanley
*Assistant Examiner* — Victor V Barzykin
(74) *Attorney, Agent, or Firm* — Schwabe, Williamson & Wyatt, P.C.

(57) ABSTRACT

Embodiments described herein may be related to apparatuses, processes, and techniques related to using full stack overlay cell (FSOL) targets within lithography masks and on fabricated layers of a substrate in order to align or to assess the alignment of fabricated layers of the substrate during the substrate manufacturing process. Other embodiments may be described and/or claimed.

8 Claims, 8 Drawing Sheets

MULTIPLE TARGETS ON SUBSTRATE LAYERS FOR LAYER ALIGNMENT

FIELD

Embodiments of the present disclosure generally relate to the field of semiconductor packaging, and in particular to aligning fabricated substrate layers.

BACKGROUND

Continued growth in virtual machines, cloud computing, and portable devices will continue to increase the demand for high density transistors within chips and packages.

DETAILED DESCRIPTION

Figure 1B:
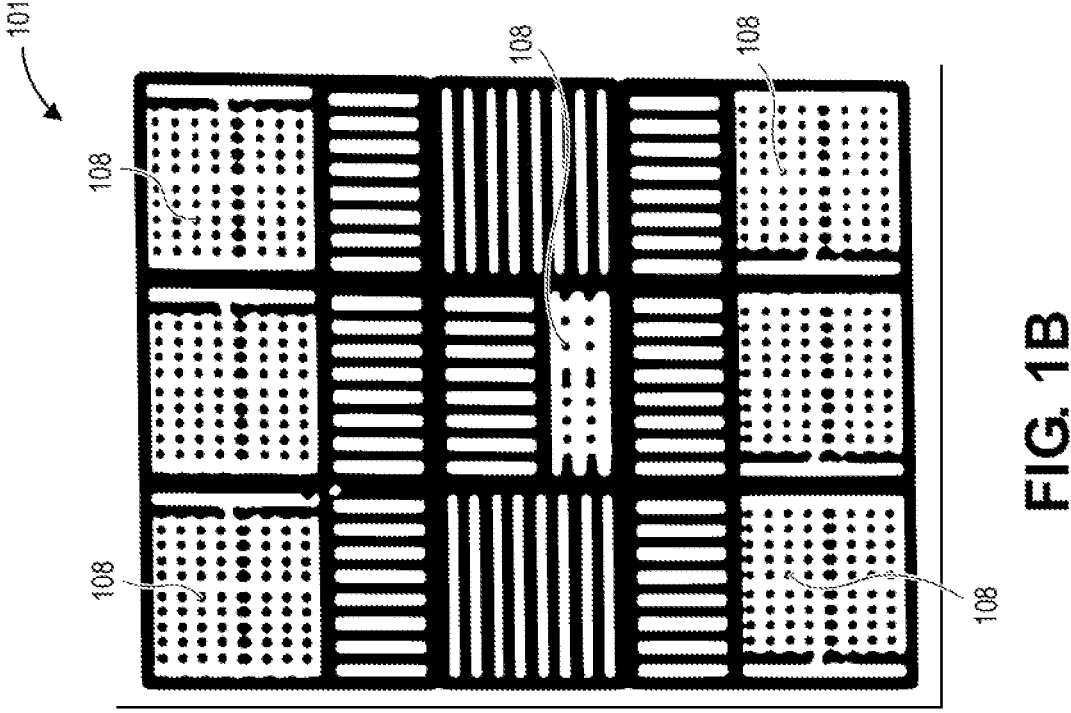
FIGS. 1A-1B illustrate example legacy implementations of mask overlay targets and mask registration targets that are used to create a layer of a substrate.

Embodiments described herein may be related to apparatuses, processes, and techniques directed to using full stack overlay cell (FSOL) targets on fabricated layers of a substrate in order to align or to assess the alignment of fabricated layers of the substrate during the fabrication process. In embodiments, FSOL targets may also be used to perform mask registration to facilitate the validation of a particular mask that has been created, for example, to be used in a lithographic process to fabricate layers of a substrate, prior to production use. In embodiments, FSOL targets may be used for both alignment of fabricated layers as well as for mask registration. These embodiments free up additional space on the mask that may now be used for active circuitry, where this freed space would have otherwise been taken up to create optical markers to assess alignment of layers during the fabrication process.

In legacy implementations, mask registration, which may also be referred to as reticle registration, was done during mask manufacture by using small targets that are spread throughout a reticle field. These small legacy targets for mask registration are designed such that they leave no pattern when printed on a wafer, for example when they are used to create a layer of a substrate. In legacy implementations, no pattern may be left also due to the mask registration targets that are printed at sub-resolution size and are not printed on the wafer. In other implementations, the mask registration may use unconstrained designs such that pattern features serve no useful purpose in wafer alignment, which may be referred to as fabrication metrology.

Legacy mask registration targets do not serve any useful purpose in the fabrication process. Hence, the real estate for these targets, which usually number in a few thousand per reticle field, went unutilized on the silicon in the fab, resulting in wasted space on the chip. Also, in legacy implementations there is no direct method to measure the overlay using active regions of a die. This made it difficult to implement higher order overlay corrections on a lithography scanner, especially for large die size products that do not contain internal scribes.

In embodiments, a FSOL target is a single target with a pattern design such that the design follows mask shop constraints of being able to measure mask registration, while also allowing overlay measurements between multiple fabrication layers using a sufficiently high energy eBeam tool that may be equipped with a backscatter detector. Embodiments described herein allow both the mask shop to measure mask registration, and the fabrication shop to measure overlay across a reticle field for any two or more layers. In embodiments, each layer may use the same target location and a unique design for that layer to be able to measure overlay for a particular layer. In embodiments, the processes described herein are compatible with an integrated process flow.

In embodiments, FSOL targets allow in-die overlay measurements, thus enabling better overlay control resulting in enhanced yields. In embodiments, the use of one target location across all layers results in significant cost savings due to small overall footprint required for the target while also allowing a very large number of these targets to be placed across the reticle.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Figure 1A:
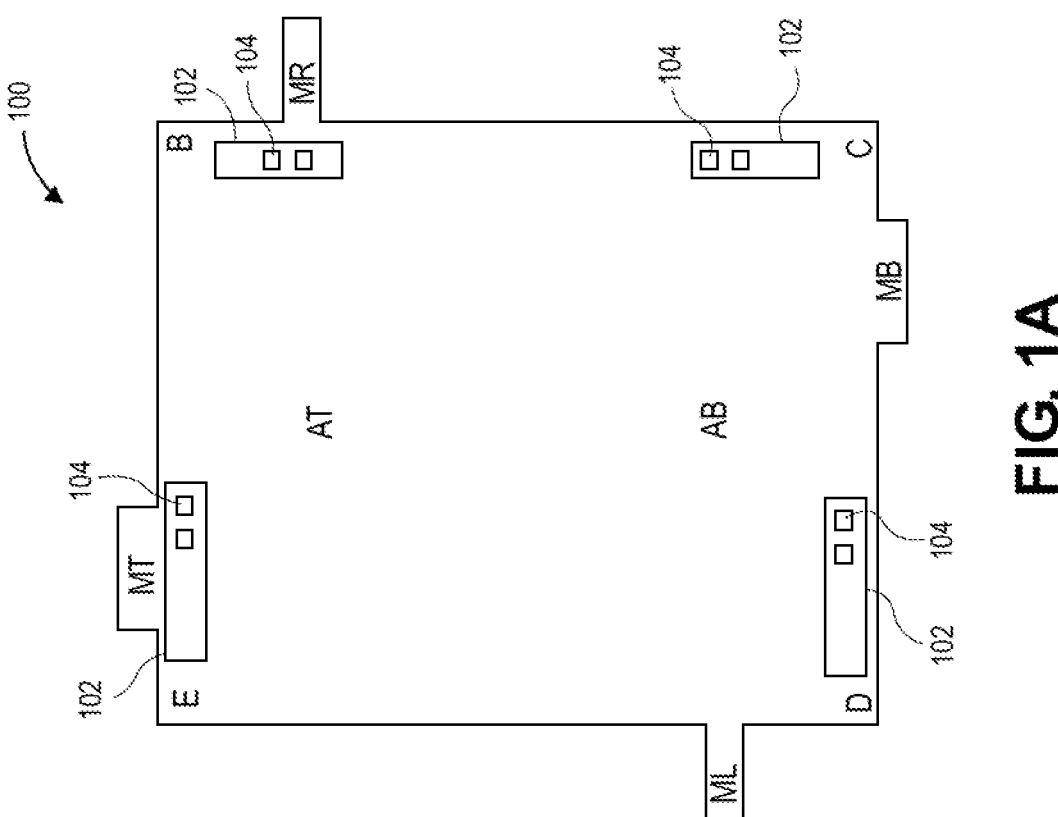

FIGS. 1A-1B illustrate example legacy implementations of mask overlay targets and mask registration targets that are used to create a layer of a substrate. FIG. 1A illustrates an example of a legacy mask 100 that is used to fabricate a layer of the substrate. In implementations, mask 100 may be one of a plurality of different masks, each corresponding to different layers of a substrate that is in the process of being fabricated. During fabrication, it is important that each subsequent mask is properly aligned with one or more of the previous layers that have just been created.

Legacy target areas 102 may be identified for legacy mask 100, into which various legacy optical targets 104 may be placed. In implementations, each of the plurality of different masks will have a different optical target 104 location within the legacy target area 102. During fabrication, the different optical targets 104 on layer may be compared with each other or with a current mask 100 that is about to be used to fabricate a layer. As a result, out of alignment conditions between fabrication layers may be identified. In addition, alignment adjustments required to a current mask 100 may be performed prior to layer fabrication. These out of alignment conditions may include shift alignment problems in an X or Y direction, rotational alignment problems, zooming problems, or other higher order misalignments.

In implementations, legacy optical targets 104 within a legacy target area 102 may have a dimension of 30 μm on each side. For substrate fabrications that have, for example, 100 layers, where each layer requires 10 targets, this results in a significant amount of mask 100 area ($1000 \times 900$ μm$^2$) that is not able to be used for circuitry, but instead is devoted to optical target 104 placement for alignment.

FIG. 1B illustrates an example of a legacy mask 101, which may be similar to mask 100, that includes a plurality of mask registration targets 108. Implementations, these mask registration targets 108 may be placed every millimeter within the mask 101. Implementations, these mask registration targets 108 are used solely to confirm the quality of a mask 101 has been produced prior to the mask 101 being used for fabrication. For example, the mask registration targets 108 may be compared to see if there are any distortions within the mask 101. Note that each of the mask registration targets 108 represents an area that may not be used for circuitry for fabrication layers produced with the mask 101.

The combination of the area taken up by the legacy target areas 102 within the mask 100, and the area taken up by the mask registration targets 108 represents a significant amount of area that is not available on the mask 100, 101 for fabricating active circuitry.

Figure 2:
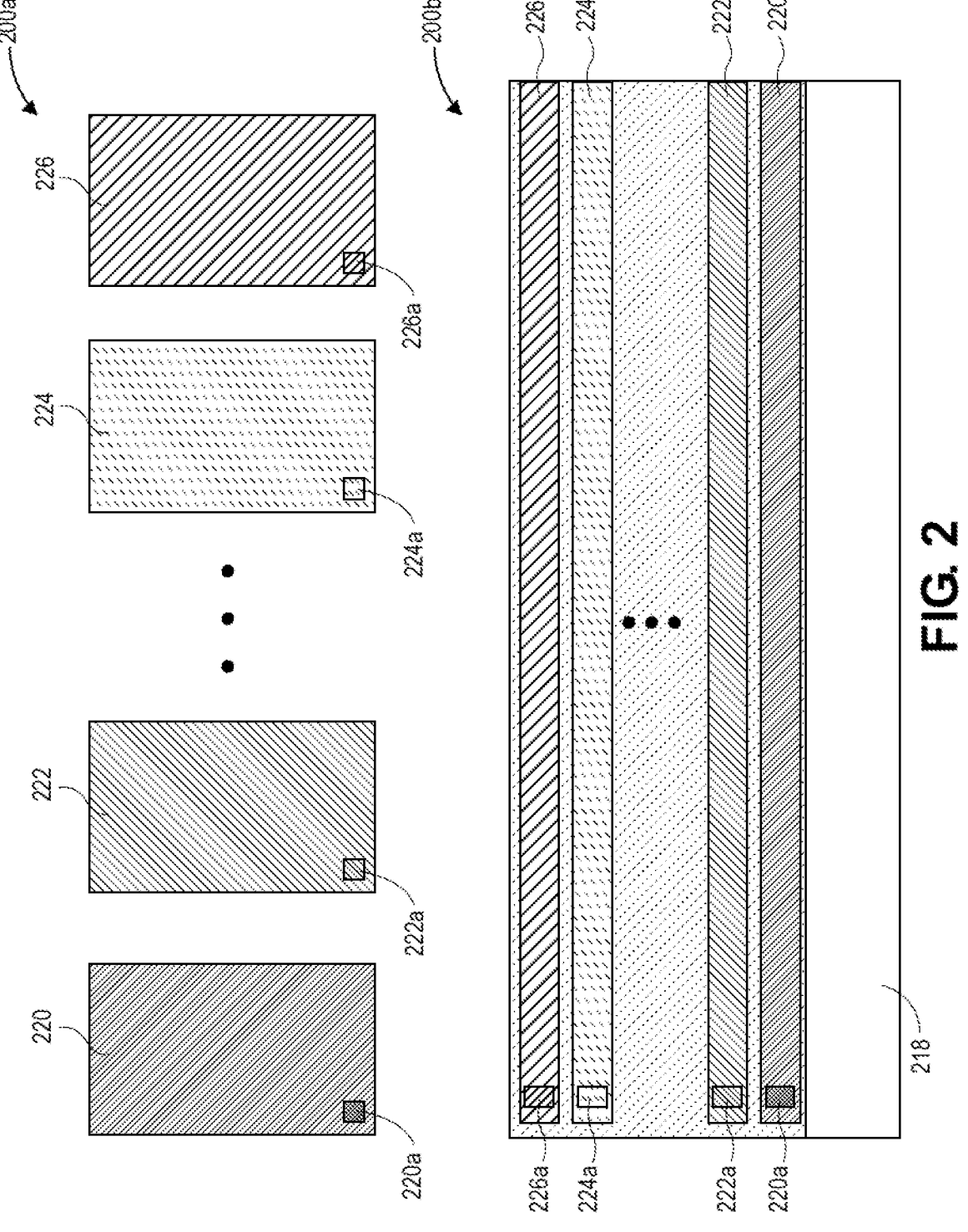
FIG. 2 illustrates a partial top-down view and a cross section side view of a full stack overlay cell (FSOL) target that is used for mask registration and mask overlay, in accordance with various embodiments.

FIG. 2 illustrates a partial top-down view and a cross section side view of a FSOL target that is used for mask registration and mask overlay within fabrication layers, in accordance with various embodiments. Diagram 200*a* shows a top-down view of a plurality of layers 220, 222, 224, 226, each of which has an example embodiment of a FSOL target 220*a*, 222*a*, 224*a*, 226*a*, which may be similar to mask registration target 108 of FIG. 1B. In embodiments, each of the plurality of layers 220, 222, 224, 226 will have a plurality of FSOL targets, for example at each one millimeter location within a layer. As a result, when FSOL targets are implemented in a mask, such as mask 101 of FIG. 1B, the plurality of FSOL targets will be able to be used for mask registration.

Substrate 200*b* shows a cross section side view of wafer 218 and layers 220, 222, 224, 226 stack on top of each other. In embodiments, where each of the plurality of layers 220, 222, 224, 226 is applied, the FSOL targets 220*a*, 222*a*, 224*a*, 226*a* will substantially overlap each other, onto which layer 1 220 may be applied. Each of the FSOL targets 220*a*, 222*a*, 224*a*, 226*a* may have a different pattern at each layer, where the different pattern may be used to identify the layer and its position relative to other layers. In embodiments, as discussed further below, the pattern within a FSOL 220*a*, may include one or more metal features in a unique pattern that is different FSOL 222*a*, 224*a*, 226*a* in other layers. In embodiments, every FSOL target within a layer will have the same unique pattern.

Figure 3:
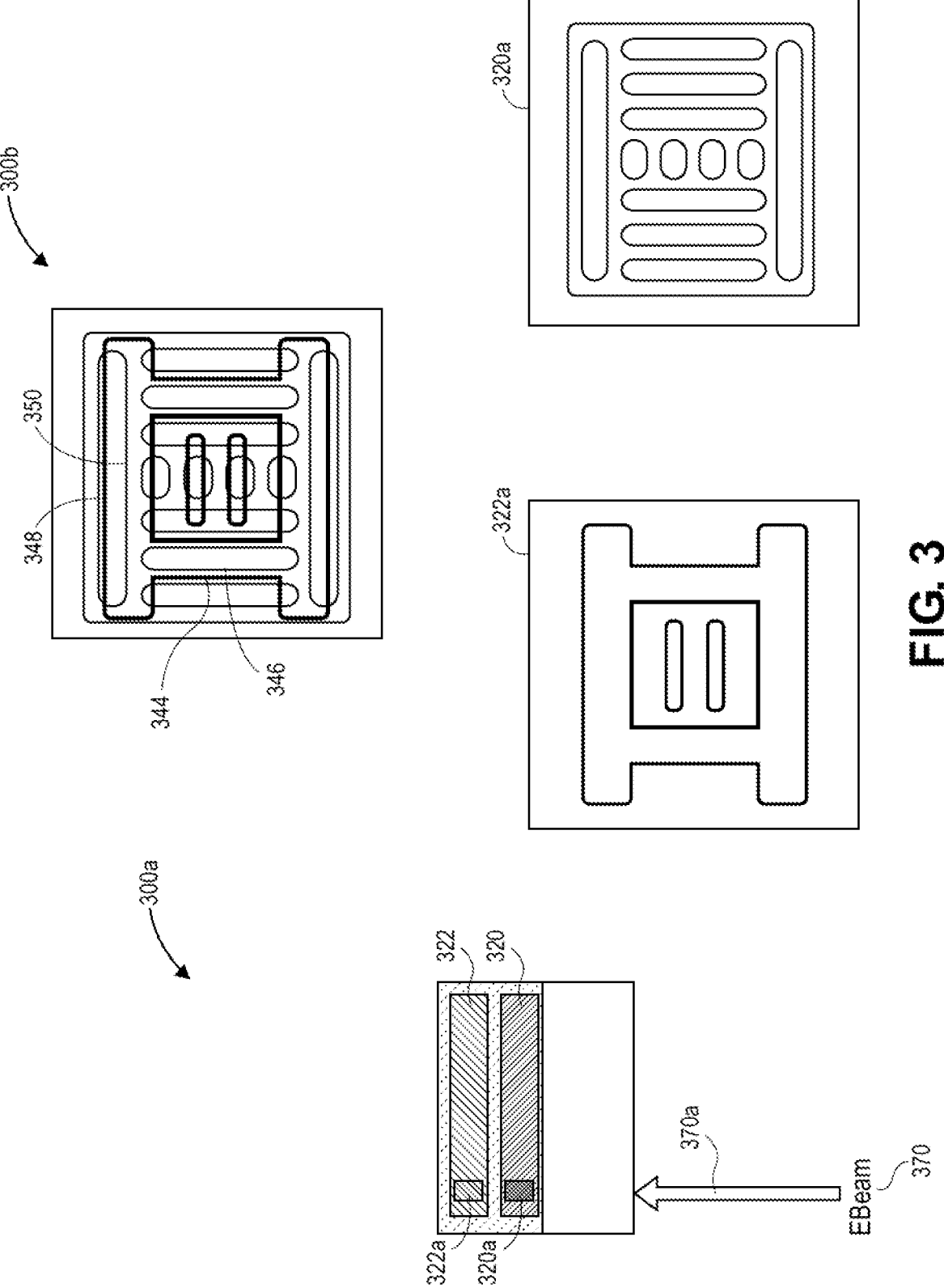
FIG. 3 illustrates example patterns of an FSOL target and an example technique to image multiple FSOL targets in multiple layers of a substrate, in accordance with various embodiments.

FIG. 3 illustrates example patterns of an FSOL target and an example technique to image multiple FSOL targets in multiple layers of a substrate, in accordance with various embodiments. Substrate 300*a*, which may be similar to substrate 200*b* of FIG. 2, includes layers 320, 322, that include, respectively, a FSOL target 320*a*, 322*a* that may be similar to layers 220, 222 and respective FSOL targets 220*a*, 222*a* of FIG. 2.

An e-beam tool 370 may shine a high energy light 370*a* through the FSOL targets 320*a*, 320*b* and produce an image 300*b*, which may show a composite of images of the FSOL targets 320*a*, 322*a*. In embodiments, the electrons generated by the e-beam tool 370 will bounce back, resulting in patterns within the image 300b. In embodiments, the image of the uppermost layer 3 22 may be brighter than an image of a lower layer 3 20. As shown, the metal patterns in 320a are significantly different from, and do not substantially overlap the metal patterns in 322a. These differences are important when analyzing the image 300b, to enable clear identification of a specific layer, and to also identify an orientation of the layer.

In embodiments, the structure of the FSOL target 320a may be compared against the FSOL target 322a to determine the degree to which the two FSOL targets are in alignment. For example, a center of mass calculation may be done with target 320a, and compared with a center of mass calculation done with target 322a, and a distance between the two calculated centers of masses may be compared to determine a degree of misalignment between the layers 320, 322. In embodiments involving calculations of center of masses, it may be beneficial for the patterns of the FSOL targets 320a, 322a to be symmetric around a first axis and also symmetric around a second axis that is orthogonal to the first axis. In other embodiments, the pattern does not have to be symmetric.

In embodiments, specific features within FSOL targets may be examined. For example, a distance between a vertical feature 344 of FSOL target 322a and a vertical feature 346 of FSOL target 320a may be compared, and a distance between a horizontal feature 348 of FSOL target 322a and a horizontal feature 350 of FSOL target 320a may be compared. The results of the comparison may indicate a degree of misalignment between the layers 320, 322.

In embodiments, the various features within the FSOL targets 320a, 322a may be nanometer-size features, which may provide more accurate alignment information between layers 320, 322. In embodiments, the large number of FSOL targets within each layer also provides a higher-order overlay extraction by using a higher order equation fit, resulting in a tighter alignment determination fit. Also, in embodiments, each FSOL target within a layer conforms to individual layer requirements. For example, a lower layer 320 may have a different design rule than the top layer, where the lower layer may pattern the smallest features at the nanometer level, with features slowly getting bigger until reaching a micron level at the top layer.

In embodiments, the FSOL targets 320a, 322a may include structures that have edges of that do not come close to each other, to minimize the risk of edge overlap, where the edges of image 300b may not be able to fully discernable from the edges of various layers 320, 322.

Figure 4:
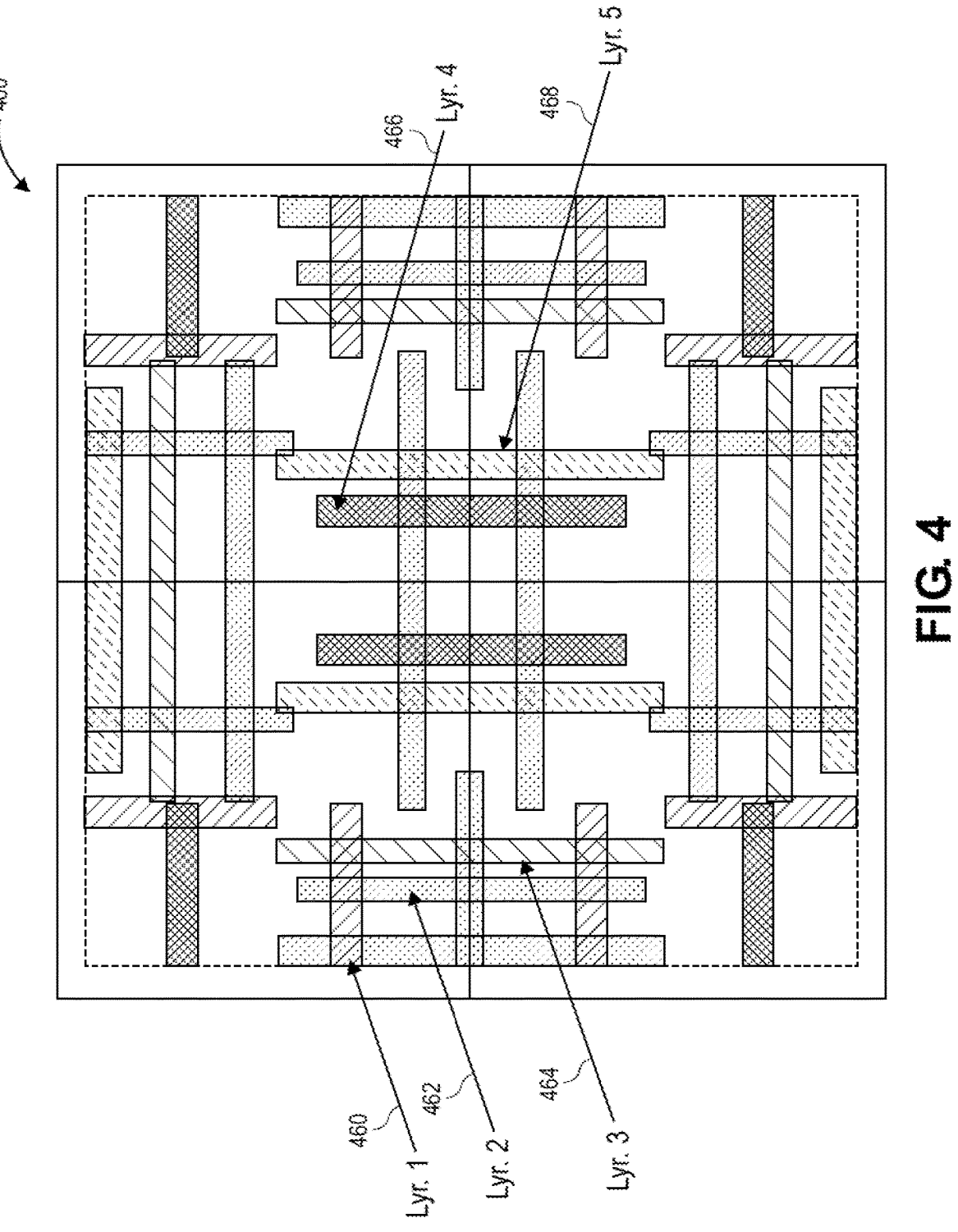
FIG. 4 illustrates a top-down view of an example of a scan of multiple FSOL targets in multiple layers of a substrate, in accordance with various embodiments.

FIG. 4 illustrates a top-down view of an example of a scan of multiple FSOL targets in multiple layers of a substrate, in accordance with various embodiments. Image 400, which may be similar to image 300b of FIG. 3, shows the result of an e-beam image of a different FSOL target in five different layers 460, 462, 464, 466, 468. As shown, a pattern of the metal features within each of the different layers is clear enough so that (1) the features of a particular layer may be identified, and (2) calculations may be made between the different features to determine a degree of misalignment among the five different layers 460, 462, 464, 466, 468.

Figure 5:
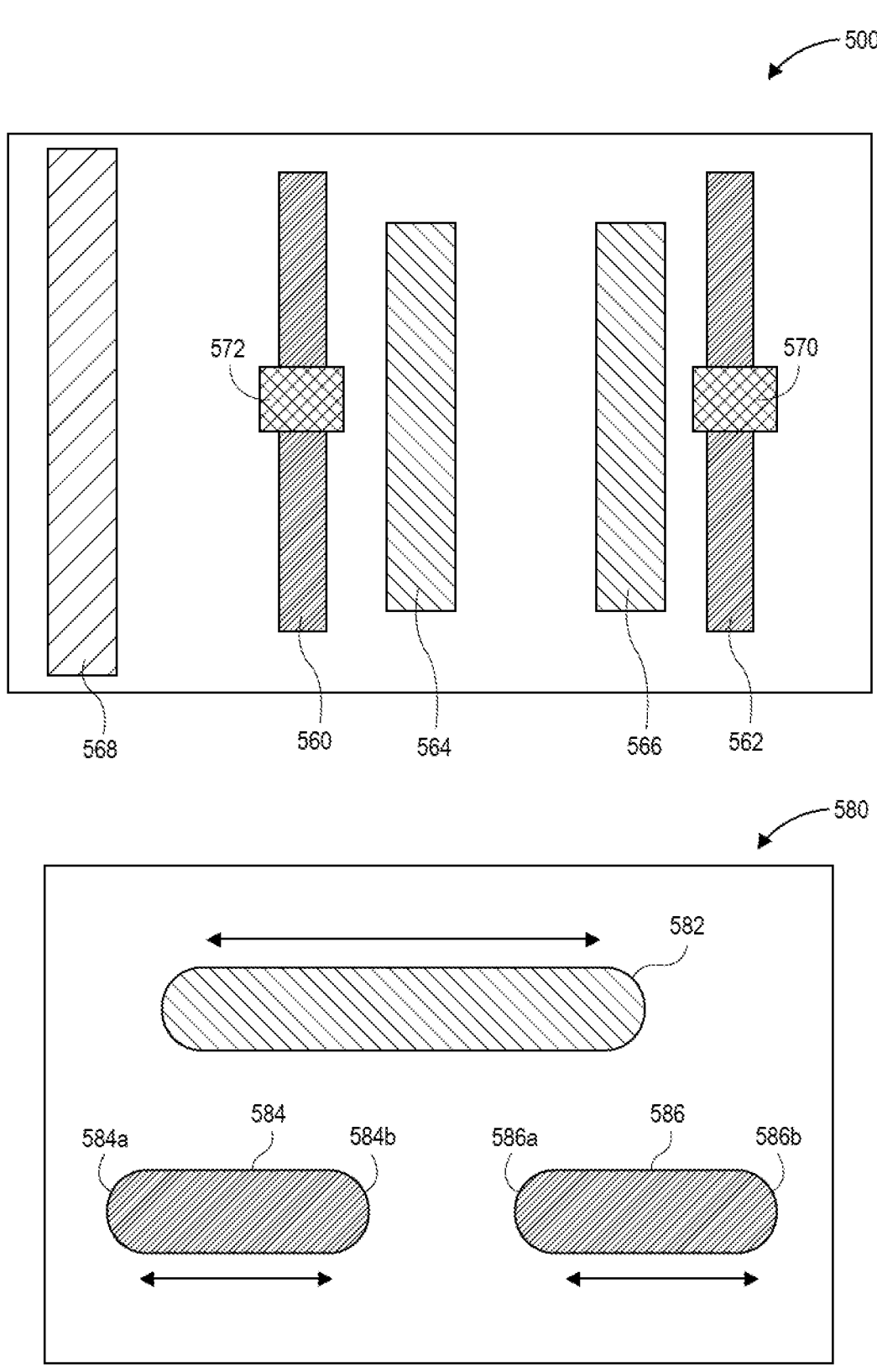
FIG. 5 illustrates examples of FSOL target patterns in multiple layers of a substrate, in accordance with various embodiments.

FIG. 5 illustrates examples of FSOL target patterns in multiple layers of a substrate, in accordance with various embodiments. Diagram 500, which may be similar to image 400 of FIG. 4, shows an illustration of a subset of features within three layers of a FSOL target in each layer. Layer 1 may include metal features 560, 562 which are vertical metal features. Layer 3 may include metal features 564, 566.

However, in contrast, layer 2 may include plug features 568, 570, that may overlap metal features 560, 562, creating, for example, a void 572 within metal structure 560. Thus, an identification of layer 2 within the diagram 500 may include identifying voids 572 within metal structures of other FSOL targets to identify the features of layer 2 and hence extract its overlay.

Additional factors may affect patterns within a FSOL target. In embodiments, the pattern of a FSOL target may be kept mirror-symmetric to avoid processor measurement induced effects on overlay measurements. In addition, where possible, longer continuous metal segments should be used instead of multiple shorter segments, because line ends may be typically rendered unusable doing to rounding of the lines during the lithography stage.

For layers that do not have any other layer that aligns to it in a given direction, in embodiments edges may be overlaid with underlying layers. When measuring overlay of that layer, the edges from the resist features will be isolated in a secondary electron detector channel, whereas post patterning at that layer, interference from the underlayers in the backscatter channel may not matter. However, in embodiments these features may be placed on the edge of the FSOL target to help with throughput on other layers.

For creating align-to features for plug layers, as discussed above with respect to FIG. 5, the plugs can be placed longitudinally within a thick corresponding metal line to create a plug edge, thus allowing the same metal feature to yield both metal and plug overlay information.

In addition, to keep too many underlayer edges from interfering from identifying clear patterns for each layer, areas within the cell that contain vertical and horizontal features can be flipped every few layers. Embodiments of this may be seen with respect to image 400 of FIG. 4.

Figure 6:
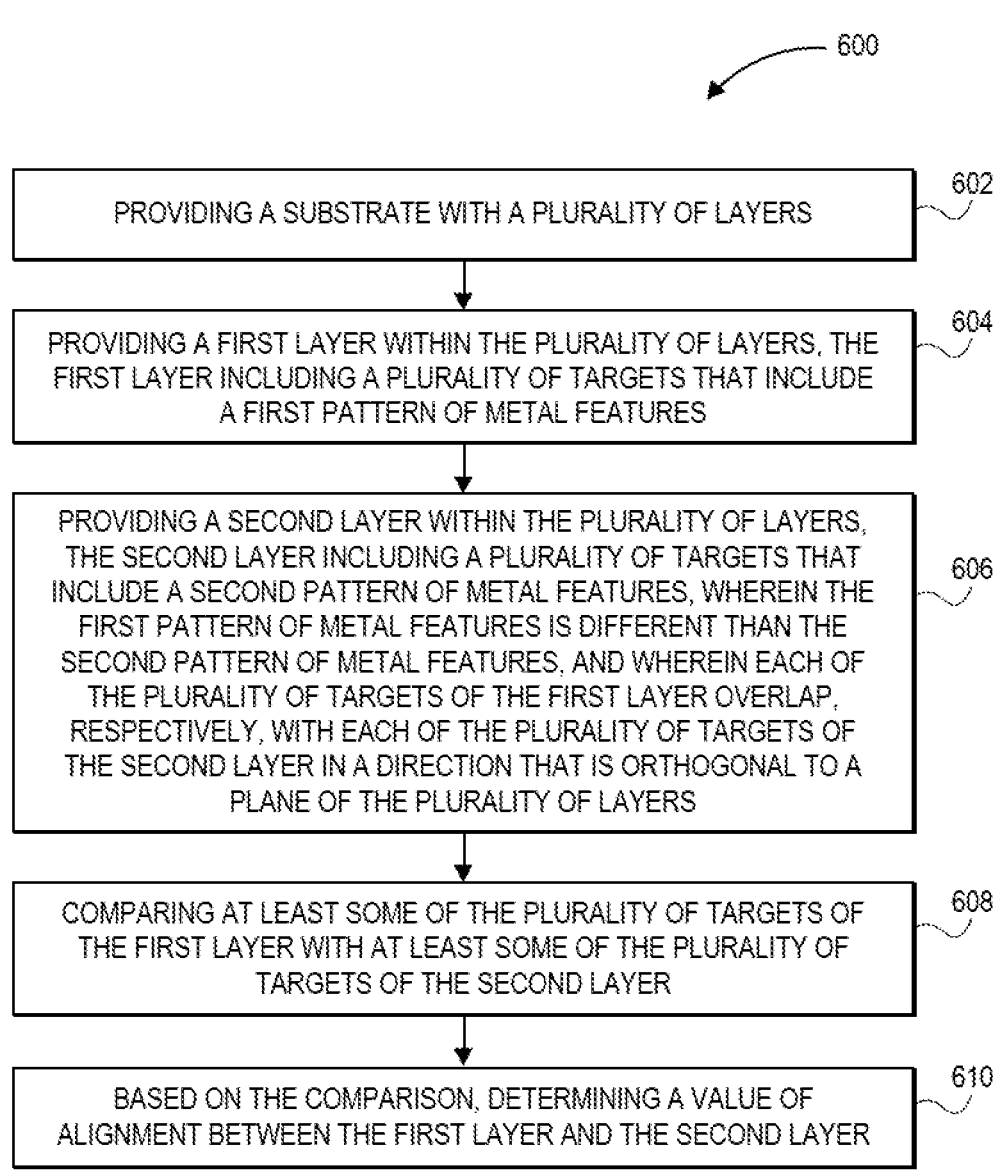
FIG. 6 illustrates an example process for determining an alignment between a first layer and a second layer of a substrate using multiple FSOL target patterns, in accordance with various embodiments.

FIG. 6 illustrates an example process for determining an alignment between a first layer and a second layer of a substrate using multiple FSOL target patterns, in accordance with various embodiments. Process 600 may be implemented using the techniques and/or embodiments described herein, and in particular with respect to FIGS. 1-6.

At block 602, the process may include providing a substrate with a plurality of layers.

At block 604, the process may further include providing a first layer within the plurality of layers, the first layer including a plurality of targets that include a first pattern of metal features.

At block 606, the process may further include providing a second layer within the plurality of layers, the second layer including a plurality of targets that include a second pattern of metal features, wherein the first pattern of metal features is different than the second pattern of metal features, and wherein each of the plurality of targets of the first layer overlap, respectively, with each of the plurality of targets of the second layer in a direction that is orthogonal to a plane of the plurality of layers.

At block 608, the process may further include comparing at least some of the plurality of targets of the first layer with at least some of the plurality of targets of the second layer.

At block 610, the process may further include, based on the comparison, determining a value of alignment between the first layer and the second layer.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or gate-all-around transistors such as nanoribbon and nanowire transistors. Although the implementations described herein may illustrate only Finfet transistors, it should be noted that the invention may also be carried out using planar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO$_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
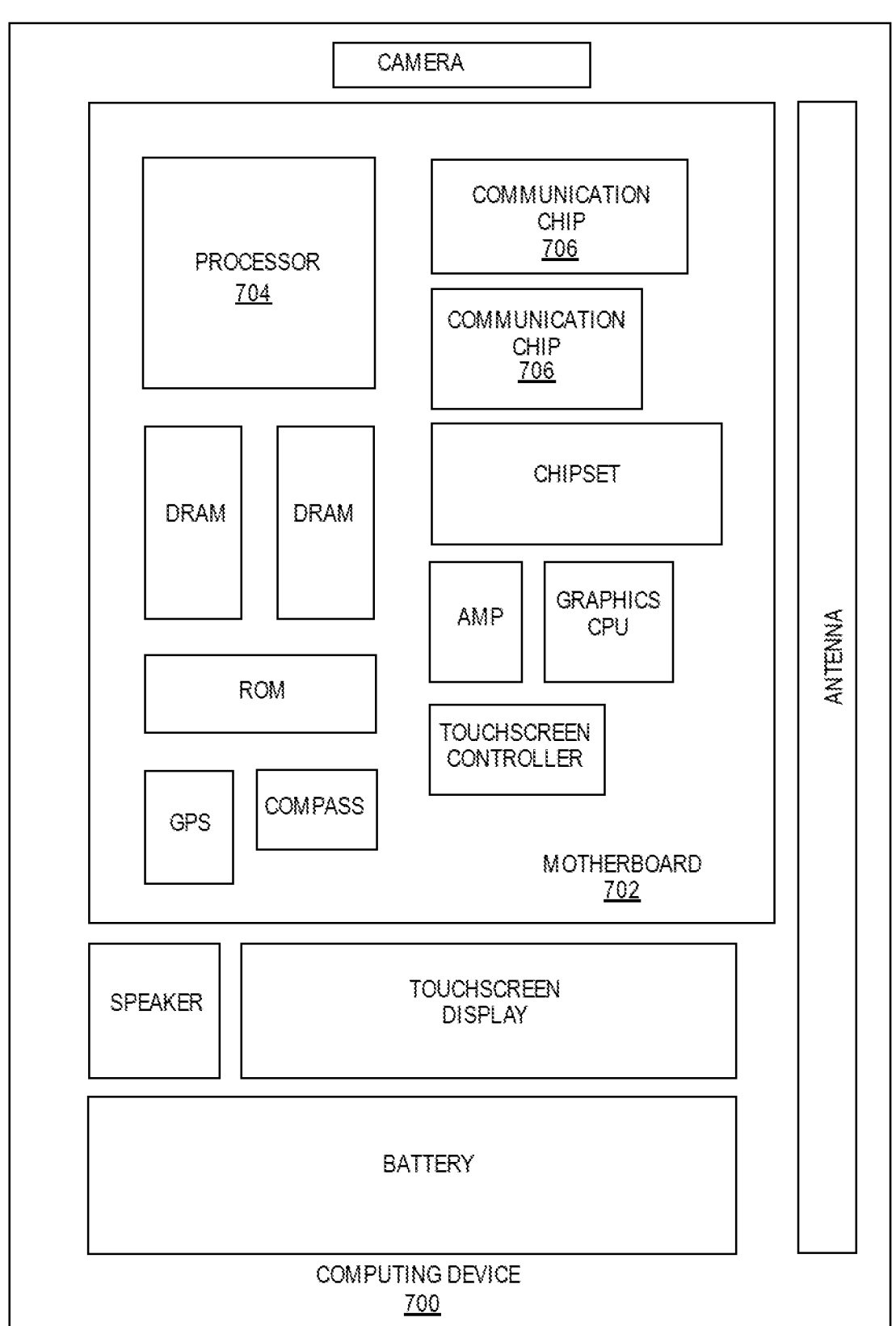
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
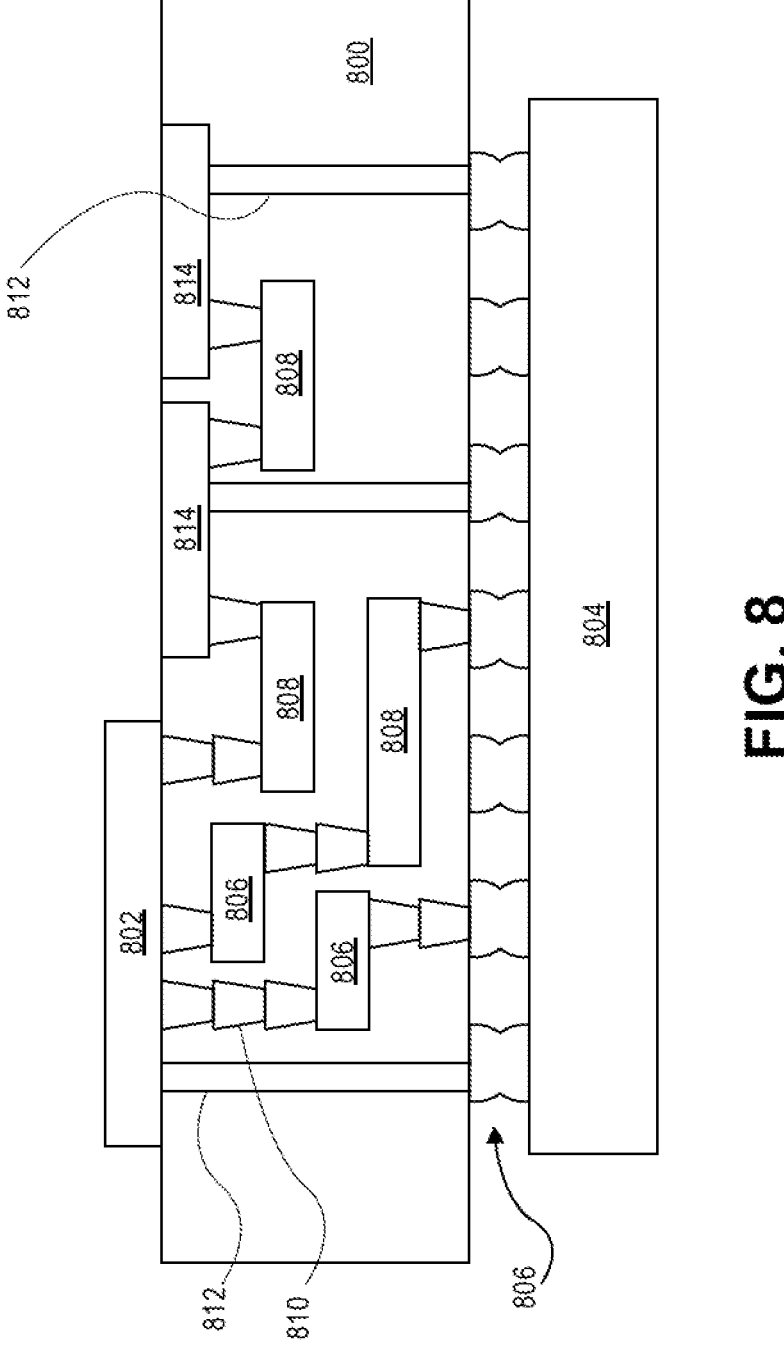
FIG. 8 illustrates an interposer that includes one or more embodiments of the invention.

FIG. 8 illustrates an interposer that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a substrate comprising: a plurality of layers; a plurality of targets on each of the plurality of layers; wherein each of the plurality of the targets on a first layer of the plurality of the layers overlap, respectively, with each of the plurality of the targets on a second layer of the plurality of layers in a direction that is orthogonal to a plane of the plurality of layers; wherein the plurality of targets on the first layer include a first pattern; wherein the plurality of targets on the second layer include a second pattern; and wherein the first pattern is different than the second pattern.

Example 2 includes the substrate of example 1, or of any other example or embodiment herein, wherein the first pattern and the second pattern include one or more metal features.

Example 3 includes the substrate of example 2, or of any other example or embodiment herein, wherein at least a portion of the metal features of the first pattern and at least a portion of the metal features of the second pattern do not overlap.

Example 4 includes the substrate of example 2, or of any other example or embodiment herein, wherein the one or more metal features of the first pattern are symmetric around an axis.

Example 5 includes the substrate of example 4, or of any other example or embodiment herein, wherein the axis is a first axis; and wherein one or more metal features of the first pattern are symmetric around a second axis that is orthogonal to the first axis.

Example 6 includes the substrate of example 2, or of any other example or embodiment herein, wherein a comparison of the plurality of targets on the first layer with the plurality of targets on the second layer determines a degree of alignment between the first layer and the second layer.

Example 7 includes the substrate of example 2, or of any other example or embodiment herein, wherein the metal features of the first pattern and the metal features of the second pattern are not electrically coupled with other metal features in the substrate.

Example 8 includes the substrate of example 1, or of any other example or embodiment herein, wherein the plurality of targets on the first layer and the plurality of targets on the second layer are arranged in a grid.

Example 9 includes a substrate of example 8, or of any other example or embodiment herein, wherein a horizontal distance or a vertical distance between a subset of the plurality of target regions in the first layer is less than 1 mm.

Example 10 includes the substrate of example 1, or of any other example or embodiment herein, wherein a width of the target region or a height of the target region is 2 μm or less.

Example 11 is an apparatus comprising: a mask; a plurality of target regions on the mask, wherein each of the plurality of target regions includes a same pattern, wherein the pattern indicates a position of one or more metal features on a layer of a substrate on a wafer; and wherein values of one or more distances between at least some of the plurality of target regions on the mask identifies whether the mask is suitable for a lithography process.

Example 12 includes the apparatus of example 11, or of any other example or embodiment herein, wherein the pattern identifies the layer of the substrate on the wafer.

Example 13 includes the apparatus of example 11, or of any other example or embodiment herein, wherein a horizontal distance or a vertical distance between two target regions is approximately 1 mm.

Example 14 includes the apparatus of example 11, or of any other example or embodiment herein, wherein a shape of the target region is a rectangle.

Example 15 includes the apparatus of example 11, or of any other example or embodiment herein, wherein the plurality of target regions are arranged in a grid pattern on the mask.

Example 16 includes the apparatus of example 11, or of any other example or embodiment herein, wherein the pattern is symmetric around a first axis.

Example 17 includes the apparatus of example 16, or of any other example or embodiment herein, wherein the pattern is symmetric around a second axis that is orthogonal to the first axis.

Example 18 is a method comprising: providing a substrate with a plurality of layers; providing a first layer within the plurality of layers, the first layer including a plurality of targets that include a first pattern of metal features; providing a second layer within the plurality of layers, the second layer including a plurality of targets that include a second pattern of metal features, wherein the first pattern of metal features is different than the second pattern of metal features, and wherein each of the plurality of targets of the first layer overlap, respectively, with each of the plurality of targets of the second layer in a direction that is orthogonal to a plane of the plurality of layers; comparing at least some of the plurality of targets of the first layer with at least some of the plurality of targets of the second layer; and based on the comparison, determining a value of alignment between the first layer and the second layer.

Example 19 may include the method of example 18, or of any other example or embodiment herein, wherein comparing at least some of the plurality of targets of the first layer with at least some of the plurality of targets of the second layer further includes: passing an electron beam through one of the plurality of targets of the first layer and one of the plurality of targets of the second layer; capturing an image of the electron beam after it passes through the one of the plurality of targets of the first layer and the one of the plurality of targets of the second layer; and identifying, based on the captured image, the first pattern of the first layer and the second pattern of the second layer.

Example 20 may include the method of example 19, or of any other example or embodiment herein, wherein determining a value of alignment between the first layer and the second layer further comprises: determining, based upon the identified first pattern of the first layer, a location of a center of mass of the first pattern; determining, based upon the identified second pattern of the second layer, a location of a center of mass of the second pattern; determining a distance between the location of the center of mass of the first pattern and the location of the center of mass of the second pattern; and based upon the distance, determining a value of alignment between the first layer and the second layer.

What is claimed is:

1. A substrate comprising:
a plurality of layers;
a plurality of targets on each of the plurality of layers;
wherein individual ones of the plurality of the targets on a first layer of the plurality of the layers overlap, respectively, with a corresponding one of the plurality of the targets on a second layer of the plurality of layers in a top-down view;

wherein the plurality of targets on the first layer include a first pattern with a metal feature having a longest dimension along a first direction;

wherein the plurality of targets on the second layer include a second pattern with a metal feature overlapping the metal feature of the first pattern in the top-down view, the metal feature of the second pattern having a longest dimension along a second direction, the second direction orthogonal to the first direction in the top-down view; and wherein the first pattern is different than the second pattern.

2. The substrate of claim 1, wherein the metal feature of the first pattern is symmetric around an axis.

3. The substrate of claim 2, wherein the axis is a first axis; and wherein a second metal feature of the first pattern is symmetric around a second axis that is orthogonal to the first axis.

4. The substrate of claim 1, wherein a comparison of the plurality of targets on the first layer with the plurality of targets on the second layer determines a degree of alignment between the first layer and the second layer.

5. The substrate of claim 1, wherein the metal features of the first pattern and the second pattern are not electrically coupled with other metal features in the substrate.

6. The substrate of claim 1, wherein the plurality of targets on the first layer and the plurality of targets on the second layer are arranged in a grid.

7. The substrate of claim 6, wherein a horizontal distance or a vertical distance between a subset of the plurality of target regions in the first layer is less than 1 mm.

8. The substrate of claim 1, wherein a width of the target region or a height of the target region is 2 μm or less.

* * * * *